United States Patent

Vela et al.

[11] Patent Number: 5,828,671
[45] Date of Patent: Oct. 27, 1998

[54] METHOD AND APPARATUS FOR DEINTERLEAVING AN INTERLEAVED DATA STREAM

[75] Inventors: Oscar Gustavo Vela, Pembroke Pines; Kin Chau-Lee, Boynton Beach; Paul H. Kelley, Boca Raton, all of Fla.

[73] Assignee: Motorola, Inc., Schaumburg, Ill.

[21] Appl. No.: 633,848

[22] Filed: Apr. 10, 1996

[51] Int. Cl.$^6$ .................................................. G06F 11/00
[52] U.S. Cl. ........................... 371/2.1; 711/127; 711/157; 364/246.4; 364/966.3
[58] Field of Search .................. 371/2.1, 2.2, 37.1, 371/37.5, 40.1, 40.2, 37.01, 40.17, 40.18, 40.11; 711/147, 157, 127; 364/245, 246, 246.4, 945, 957, 957.1, 966.1, 966.3, 970

[56] References Cited

U.S. PATENT DOCUMENTS

| | | | |
|---|---|---|---|
| 4,394,642 | 7/1983 | Currie et al. | 340/347 |
| 4,633,486 | 12/1986 | Berlekamp et al. | 375/368 |
| 5,056,112 | 10/1991 | Wei | 371/37.02 |
| 5,063,533 | 11/1991 | Erhart et al. | 395/425 |
| 5,168,493 | 12/1992 | Nelson et al. | 370/314 |
| 5,237,320 | 8/1993 | Sato et al. | 340/825.44 |
| 5,506,845 | 4/1996 | Kamishima | 370/465 |
| 5,548,752 | 8/1996 | Lloyd et al. | 395/611 |
| 5,566,183 | 10/1996 | Partyka | 371/2.1 |

FOREIGN PATENT DOCUMENTS

0 264 205  4/1988  European Pat. Off. .

*Primary Examiner*—Trinh L. Tu
*Attorney, Agent, or Firm*—R. Louis Breeden; Pablo Meles

[57] ABSTRACT

A method and apparatus deinterleave data blocks each transmitted as a sequence of data groups including N bits of data from a single bit position of N words. A first data block is received (1004) and stored (1006) in a memory (402) in a manner that defines memory locations for each of the N words, thereby deinterleaving the first data block. A next data block is received by processing (1008) at least a portion of the N words stored previously in the memory, thereby providing free memory locations, and thereafter receiving (1012) new data including at least a portion of a next data group of the next data block. The new data is stored (1014) in at least a portion of the free memory locations, and processing continues until the next data block has been received and stored in entirety. The memory locations are then redefined (1018) for the N words, thereby deinterleaving the next data block.

18 Claims, 9 Drawing Sheets

| BIT | 0 | 1 | 2 | 3 | | 28 | 29 | 30 | 31 | 202 |
|---|---|---|---|---|---|---|---|---|---|---|
| WORD 0 | | | | | | | | | | |
| WORD 1 | | | | | | | | | | |
| WORD 2 | | | | | | | | | | |
| WORD 4 | | | | | | | | | | |
| WORD 28 | | | | | | | | | | |
| WORD 29 | | | | | | | | | | |
| WORD 30 | | | | | | | | | | |
| WORD 31 | | | | | | | | | | |

FIG. 3
300

Columns (top labels): WORD 0, WORD 1, WORD 2, WORD 4, ... WORD 28, WORD 29, WORD 30, WORD 31 — 202

BIT: 0, 1, 2, 3, ... 28, 29, 30, 31

METHOD AND APPARATUS FOR DEINTERLEAVING AN INTERLEAVED DATA STREAM

RELATED APPLICATION

Application Ser. No. 08/372,421, filed Jan. 13, 1995, by Mantel et al.,is patented as a U.S. Pat. No. 5,602,875 on Feb. 11, 1997, entitled "Method and Apparatus for Encoding and Decoding Information in a Digital Communication System".

FIELD OF THE INVENTION

This invention relates in general to communication receivers, and more specifically to a method and apparatus for deinterleaving an interleaved data stream received by a communication receiver.

BACKGROUND OF THE INVENTION

Modern data communication systems utilize interleaved data transmission for improved immunity to burst errors. Such systems typically arrange code words in a rectangular array in a memory prior to transmission. During the transmission, the bits in a first bit position of all the code words in the array are transmitted in a group, followed by the bits in a next bit position of all the code words in a next group, and so on until all the bits of all the code words have been transmitted. When the groups of bits are received by a communication receiver, the bits must be deinterleaved to recover the code words.

Prior art receivers use two memory arrays for performing the required deinterleaving. Operation is such that first one of the two memory arrays receives a first block of interleaved data. Then the first block of data is processed to deinterleave the data and recover the code words. Because time is required to process the first block of data and because a second block of data will begin arriving shortly after the end of the first block of data, a second one of the two memory arrays receives the second block of data while the first block of data is being processed. This process continues with the two memory arrays being utilized alternately for receiving and processing the incoming blocks of data.

A difficulty arises in modern, high speed data communication systems, because of the large sizes used for the blocks of data. For example, a block size of 1024 bits is not uncommon, and would require two independent 1024-bit memory arrays along with memory support circuitry for deinterleaving by prior art techniques. The requirement for two independent 1024-bit memory arrays can add significantly to the size and cost of the integrated circuits comprising the memory arrays. In addition, power consumption, which is of great concern in portable communication applications, is increased by having the two memory arrays.

Thus, what is needed is a method and apparatus that can accomplish deinterleaving while requiring only a single memory array.

SUMMARY OF THE INVENTION

An aspect of the present invention is a method of deinterleaving an interleaved data stream transmitted as a plurality of data blocks. A data block comprises interleaved data representing N words having M bits in M bit positions. The data block is transmitted as a sequence of data groups, a data group including N bits of data from a single bit position of all the N words. The method comprises the steps of (a) receiving a first data block of the interleaved data stream, and (b) storing the first data block in a memory in a manner that defines memory locations for each of the N words, thereby deinterleaving the first data block. The method also includes the step of (c) receiving a next data block. The step of receiving the next data block comprises the steps of (d) processing at least a portion of the N words stored previously in the memory, thereby providing free memory locations, unless all of the N words have been processed, and (e) thereafter receiving new data comprising at least a portion of a next data group of the next data block. The step of receiving the next data block further comprises the steps of (f) storing the new data in at least a portion of the free memory locations, and (g) repeating steps (d), (e), and (f) until the next data block has been received and stored in entirety. The step of receiving the next data block also includes the step of (h) redefining the memory locations for the N words after the next data block has been received and stored in entirety, thereby deinterleaving the next data block.

Another aspect of the present invention is an apparatus for deinterleaving an interleaved data stream transmitted as a plurality of data blocks. A data block comprises interleaved data representing N words having M bits in M bit positions. The data block is transmitted as a sequence of data groups, a data group including N bits of data from a single bit position of all the N words. The apparatus comprises a receiver for receiving a first data block of the interleaved data stream, and a memory coupled to the receiver for storing the first data block in a manner that defines memory locations for each of the N words, thereby deinterleaving the first data block. The apparatus further comprises a processor coupled to the receiver and coupled to the memory for controlling reception of a next data block. The processor is programmed to process at least a portion of the N words stored previously in the memory, thereby providing free memory locations, unless all of the N words have been processed, and to receive new data comprising at least a portion of a next data group of the next data block. The processor is further programmed to store the new data in at least a portion of the free memory locations, and to continue to process the N words stored previously and to receive and store new data in the free memory locations provided, until the next data block has been received and stored in entirety. The processor is also programmed to redefine the memory locations for the N words after the next data block has been received and stored in entirety, thereby deinterleaving the next data block.

Another aspect of the present invention is a communication receiver for deinterleaving an interleaved data stream transmitted as a plurality of data blocks. A data block comprises interleaved data representing N words having M bits in M bit positions. The data block is transmitted as a sequence of data groups, a data group including N bits of data from a single bit position of all the N words. The communication receiver comprises an antenna for intercepting a radio signal carrying the plurality of data blocks, and a receiver coupled to the antenna for receiving a first data block of the interleaved data stream. The communication receiver further comprises a memory coupled to the receiver for storing the first data block in a manner that defines memory locations for each of the N words, thereby deinterleaving the first data block, and a user interface coupled to the memory for conveying to a user information represented by the plurality of data blocks. The communication receiver also includes a processor coupled to the receiver and coupled to the memory for controlling reception of a next data block. The processor is programmed to process at least a portion of the N words stored previously in the memory, thereby providing free memory locations, unless all of the N words have been processed, and to receive new data comprising at least a portion of a next data group of the next data block. The processor is further programmed to store the new data in at least a portion of the free memory locations, and to continue to process the N words stored previously and to receive and store new data in the free memory locations provided, until the next data block has been received and stored in entirety. The processor is also programmed to redefine the memory locations for the N words after the next data block has been received and stored in entirety, thereby deinterleaving the next data block.

DESCRIPTION OF THE PREFERRED EMBODIMENT

Figure 1:
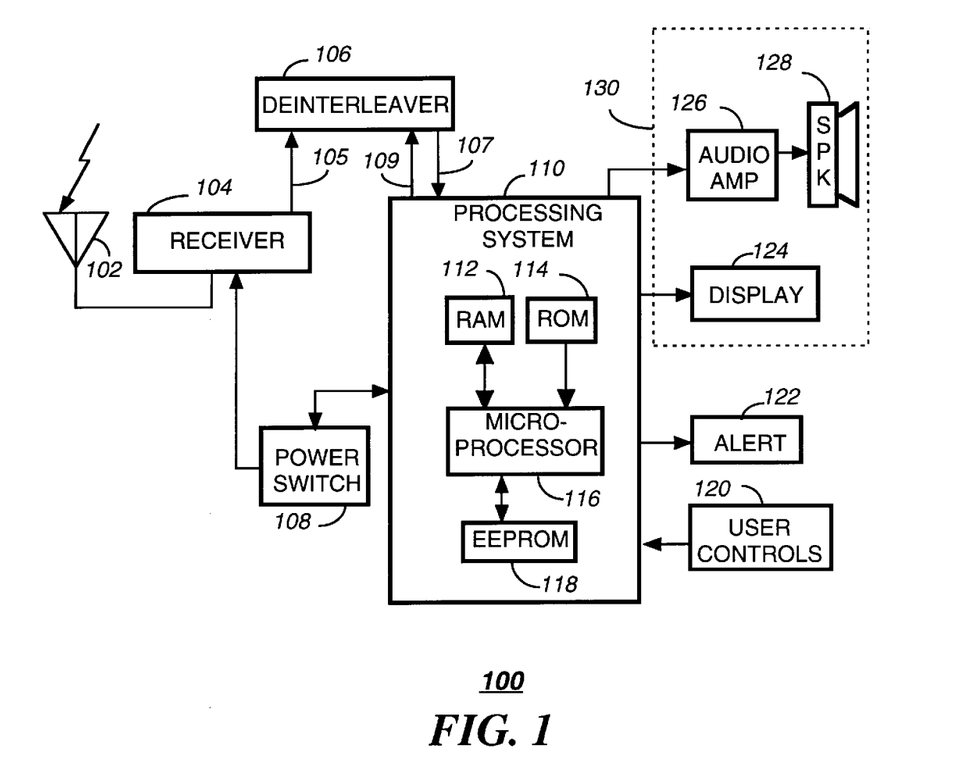
FIG. 1 is an electrical block diagram of a communication receiver in accordance with the preferred embodiment of the present invention.

Referring to FIG. 1, an electrical block diagram of a communication receiver 100 in accordance with the preferred embodiment of the present invention comprises an antenna 102 for intercepting radio frequency (RF) signals carrying blocks of interleaved data transmitted sequentially using techniques well known in the art from a conventional data communication system infrastructure (not shown). The interleaved data preferably is transmitted utilizing a well known data transmission protocol, such as Motorola's FLEX™ digital selective call signaling protocol. This protocol utilizes well-known error detection and error correction techniques and is therefore tolerant to bit errors occurring during transmission, provided that the bit errors are not too numerous in any one code word. It will be appreciated that other suitable two-way protocols such as, for example, ReFLEX™ and InFLEXion™ can be used as well. As discussed in the Background, the interleaved data bits in a first bit position of all the code words in each block of data are transmitted in a data group, followed by the bits in a next bit position of all the code words of the block transmitted in a next data group, and so on until all the bits of all the code words of the block have been transmitted.

The antenna 102 is coupled to a receiver 104 employing conventional demodulation techniques for receiving the RF signals. Radio signals received by the receiver 104 produce demodulated data, which is coupled via a bit_data line 105 to a deinterleaver 106 for deinterleaving the data to recover code words contained therein in accordance with the present invention. The deinterleaver 106 is coupled by a word bus 107 to a processing system 110 for processing the deinterleaved data to derive messages therefrom. A control bus 109 provides control signals from the processing system to the deinterleaver 106 for controlling the operation of the deinterleaver 106. A conventional power switch 108, coupled to the processing system 110, is used to control the supply of power to the receiver 104, thereby providing battery saving function.

To perform the necessary functions of the communication receiver 100, the processing system 110 includes a microprocessor 116, a random access memory (RAM) 112, a read-only memory (ROM) 114, and an electrically erasable programmable read-only memory (EEPROM) 118. Preferably, the processing system 110 is similar to the M68HC08 micro-controller manufactured by Motorola, Inc.

It will be appreciated that other similar processors can be utilized for the processing system 110, and that additional processors of the same or alternative type can be added as required to handle the processing requirements of the processing system 110. It will be also appreciated that other types of memory, e.g., EEPROM or FLASH, can be utilized for the ROM 114, as well as the RAM 112. It will be further appreciated that the RAM 112 and the ROM 114, singly or in combination, can be manufactured as an integral portion of the microprocessor 116.

The processing system 110 is programmed by way of the ROM 114 to process incoming messages. The processing system 110 decodes an address in the deinterleaved code words of the received message, compares the decoded address with one or more addresses stored in the EEPROM 118, and when a match is detected, proceeds to process the remaining portion of the message.

Once the processing system 110 has processed the message, it stores the message in the RAM 112, and a call alerting signal is generated to alert a user that a message has been received. The call alerting signal is directed to a conventional audible or tactile alerting device 122 for generating an audible or tactile call alerting signal.

The message can be accessed by the user through user controls 120, which provide functions such as lock, unlock, delete, read, etc. More specifically, by the use of appropriate functions provided by the user controls 120, the message is recovered from the RAM 112, and conveyed to the user by way of a user interface 130. The user interface 130 preferably includes a display 124, and can also include an audio amplifier 126 and speaker 128 combination. The display 124, e.g., a conventional liquid crystal display (LCD), is preferably used for displaying data messages. The audio amplifier 126 and speaker 128, if included, are used for reproducing audio voice messages.

Figure 2:
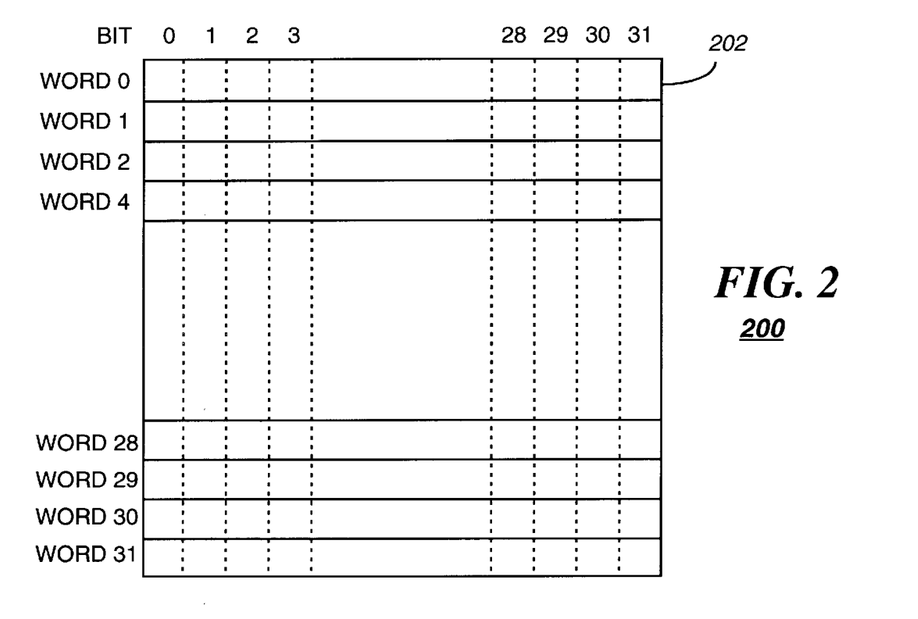
FIG. 2 is a diagram of a memory structure for deinterleaving even numbered blocks of data in accordance with an embodiment of the present invention.
Figure 3:
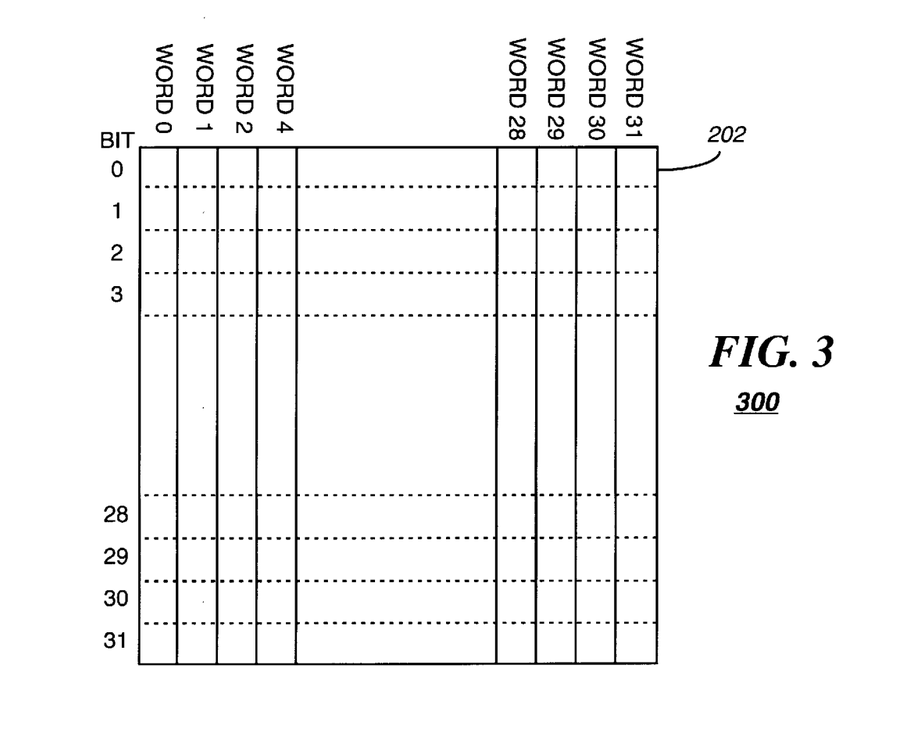
FIG. 3 is a diagram of a memory structure for deinterleaving odd numbered blocks of data in accordance with an embodiment of the present invention.

Referring to FIGS. 2 and 3, diagrams are depicted for memory structures 200, 300 for deinterleaving even and odd numbered blocks of data, respectively, in accordance with an embodiment of the present invention. The memory structures preferably are formed in a single 32-bit×32-bit (1024-bit) memory array 202. The bit data received in the data groups for a first data block (block 0), and thus all even numbered data blocks, of a frame of data is stored in the memory array 202 using the memory structure 200 as depicted in FIG. 1. As each of the data groups corresponding to a bit position of all the code words is received, the bits therein are stored columnwise in the memory array 202. After all the bits of the first data block have been received, the 32 code words of the first data block have been deinterleaved (because the locations of each of the 32 words have been defined) and can be read directly from the rows of the memory array 202.

Before a first bit of data for a second block (block 1) is received, the first 32-bit word (word 0) of block 0 has already been read from the first row of the memory array 202 for further processing. The free memory locations created by reading this first word are used to store the next data group, i.e., all bit-0-position bits for words 0 to 31 of the next block (block 1). As before, by the time a first bit 1 of word 0 of block 1 is received word 1 of block 0 has already been read from the second row of the memory array 202. Thus, the bit-1-position bits for words 0 through 31 can be stored in the free memory locations vacated by word 1 of block 0. This process continues until all 1024 bits of block 1 are received. FIG. 2 depicts how the data is stored in the memory array 202 for block 1 and thus for all odd numbered data blocks. Note that after all the data groups for block 1 have been stored in the memory array 202, the memory locations for the 32 words have been redefined as the columns of the memory array 202 (as depicted in FIG. 3). The 32 code words have thus been deinterleaved and can be read directly from the columns of the memory array 202.

It will be appreciated that, alternatively, the even numbered data blocks can be read into the memory array 202 rowwise and the deinterleaved code words read out columnwise, while the odd numbered data blocks can be read into the memory array 202 columnwise and the deinterleaved code words read out rowwise. It will be further appreciated that, alternatively, other more complex memory structures can be utilized for storing the data blocks and recovering the deinterleaved code words. It will also be appreciated that, alternatively, the data blocks are not required to be square; i.e., the data blocks can be N×M, where N and M are not equal. For example, a data block of eight 32-bit words can be deinterleaved in accordance with the present invention. Of course, with a non-square data block the mapping of the bits into the memory array would not be as simple as swapping rows and columns for every alternate block.

In the preferred embodiment in accordance with the present invention, the memory array utilized for deinterleaving the data blocks is a RAM 402 (FIG. 4) of 128 8-bit words. This configuration was selected because it required less support logic and also because it resulted in a smaller die area; i.e., a 32×32 RAM would have taken more support logic and a larger die area than a 128×8 RAM. In this instance although the data blocks are square, the mapping of the bits into the RAM 402 cannot be done by simply swapping rows and columns for alternate data blocks, because the memory array itself is not square, as explained in further detail herein below.

Figure 4:
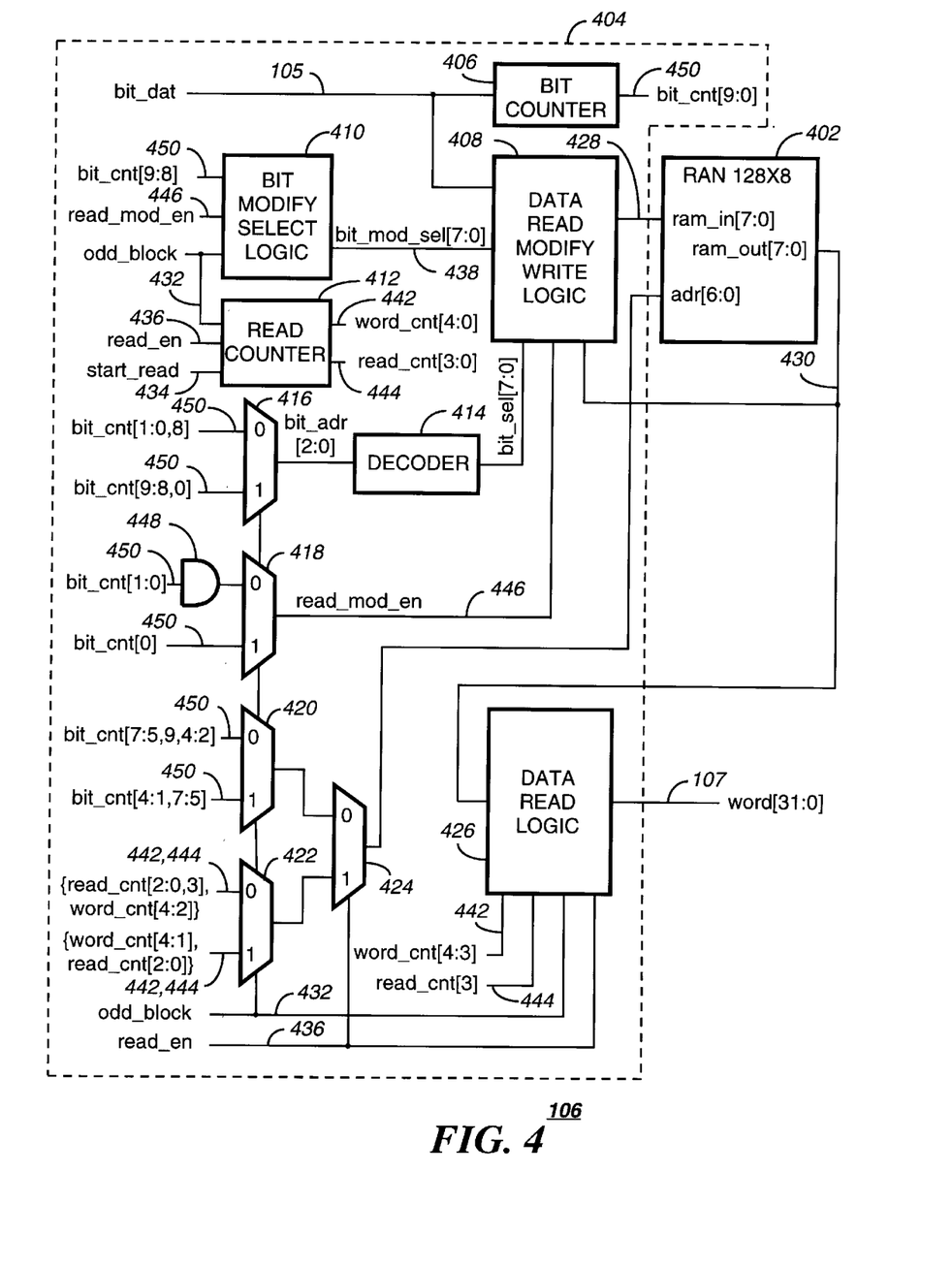
FIG. 4 is an electrical block diagram of a deinterleaver in accordance with the preferred embodiment of the present invention.

The bit locations in the RAM 402 where the 1024 bits of each data block are stored have been selected to minimize the number of read and write accesses to the RAM 402, thus saving power. The read and write addresses to the RAM 402 are defined by the following equations:

For writing incoming data groups of even data blocks:

$$\text{bit\_adr}(9:0) = \text{bit\_cnt}(7:5,9,4:0,8). \quad \{1\}$$

For reading deinterleaved code words of even data blocks:

$$\text{bit\_adr}(9:0) = \text{word\_dat\_adr}(2:0,4,9:5,3). \quad \{2\}$$

For writing incoming data groups of odd data blocks:

$$\text{bit\_adr}(9:0) = \text{bit\_cnt}(4:1,7:5,9:8,0). \quad \{3\}$$

For reading deinterleaved code words of odd data blocks:

$$\text{bit\_adr}(9:0) = \text{word\_dat\_adr}(9:6,2:0,4,3,5). \quad \{4\}$$

In the above equations the numbers within the parentheses define a correspondence between the various bits of the parameters. For example, equation {1} indicates that bits 9 through 0 of the parameter "bit_adr" correspond, respectively, to bits 7 through 5, 9, 4 through 0, and 8 of the parameter "bit_cnt".

The parameter "bit_cnt" keeps count of the bits coming into the RAM 402. The value of "bit_cnt" starts at 0 with the first bit of a block and ends at 1023 indicating the last bit of a block. The value of "bit$_{cnt}$" is increased by one every time a new bit comes into the deinterleaver 106. The parameter "bit_adr" indicates the bit location where a bit of data is stored within the RAM 402. The 7 most significant bits (MSBs) of "bit_adr" point to one of the 128 memory words of the RAM 402 in which the bit data is stored, while the 3 least significant bits (LSBs) indicate in which of the eight bit locations within the memory word the input bit data is stored. The parameter "word_dat_adr" identifies one of the 32-bit words to be read from the RAM 402. The 5 MSBs of "word_dat_adr" identify each of the 32-bit words while the 5 LSBs indicate each of the 32 bits of the 32-bit word.

For even block data, a word in the RAM 402 gets updated only once every four bits of data received. This can be seen by noticing that the 7 MSBs of "bit_adr" change after an increase of four in "bit_cnt". This results in 256 read-modify-writes (512 memory accesses) for all 1024 bits in a block. Since the 32-bit word to be read from the RAM 402 has been distributed among sixteen memory locations, it takes sixteen two-bit reads to read this word. Thus, it takes 512 reads to read all 1024 bits. This gives a total of 1024 accesses to the RAM 402 for even block data.

For odd block data, a word in the RAM 402 gets updated only once every two bits of data received. This can be seen by noticing that the 7 MSBs of "bit_adr" change after an increase of two in "bit_cnt". This results in 512 read-modify-writes (1024 memory accesses) for all 1024 bits in a block. Since the 32-bit word to be read from the RAM 402 has been distributed among eight memory locations it takes eight four-bit reads to read this word. Thus, it takes 256 reads to read all 1024 bits. This gives a total of 1280 accesses to the RAM for odd block data.

If the bit data were stored in continuous locations in the RAM 402, then it would take 1024 read-modify-writes (2048 memory accesses) and 128 reads for the even blocks, and 128 writes and 1024 reads for the odd blocks. This would require a total of 3328 memory accesses. The more complex memory structure utilized in accordance with the preferred embodiment of the present invention requires only 2304 memory accesses. This advantageously decreases the number of memory accesses by about 31%, thereby conserving power.

FIG. 4 is an electrical block diagram of the deinterleaver 106 in accordance with the preferred embodiment of the present invention. The deinterleaver comprises the RAM 402 coupled to a processor 404 for controlling the deinterleaving of the data blocks arriving from the receiver 104 via the bit_data line 105. The processor 404 comprises a data read-modify-write logic circuit 408 coupled to the RAM 402 for writing the incoming data blocks into the RAM 402 by generating an eight-bit ram_in (RAM input) signal 428. In addition, the processor 404 includes a conventional bit counter 406 coupled to the bit_data line 105 for counting the bits of the data blocks as they are received and for generating a ten-bit bit_cnt (bit count) signal 450 which defines the current number of bits received. (This signal is the bit_cnt value referred to in equations {1} and {3}.)

The processor 404 further comprises a bit modify select logic circuit 410 for generating an eight-bit bit_mod_sel (bit modify select) signal for selecting which bits of an addressed word of the RAM 402 are read from the RAM 402 and stored in registers 506 (FIG. 5) of the data read-modify-write logic circuit 408, while writing data to the RAM 402 in accordance with equations {1} and {3}. The bit modify select logic circuit 410 is responsive to the bit_cnt signal 450, to a read_mod_en (read-modify-enable) signal 446 generated by a conventional multiplexer 418 having a conventional AND gate coupled to the 0 input thereof, the multiplexer 418 responsive to the bit_cnt signal 450 and controlled by an odd_block signal 432 supplied by the processing system 110 via the control bus 109. The processor 404 also includes a read counter logic circuit 412 coupled to the odd_block signal 432, and coupled to a read_en (read enable) signal 446 and a start_read signal 434, both generated by the processing system 110 and supplied via the control bus 109. The read counter logic circuit 412 generates a word_cnt (word count) signal 442 and a read_cnt (read count) signal 444, which are selectively used by a conventional multiplexer 422 controlled by the odd_block signal 432 for controlling the addressing of the RAM 402 when reading deinterleaved code words from the RAM 402.

The processor 404 further comprises conventional multiplexer 416 responsive to the bit_cnt signal 450 and controlled by the odd_block signal 432 for selecting, via a conventional decoder 414, one of eight bit positions in the addressed word in the RAM 402 for writing an incoming data bit. Again, the bit position is selected in accordance with equations {1} and {3}. The word address in the RAM 402 for writing the incoming data bits is determined by a multiplexer 420 coupled to the bit_cnt signal 450 and controlled by the odd_block signal, and further selected by a multiplexer 424 responsive to the read_en signal 436. The processor 404 also includes a data read logic circuit 426 coupled to the RAM 402 for receiving a ram_out (RAM output) signal 430 for reading data from the RAM 402. The data read logic circuit 426 is also coupled to the word_cnt signal 442, the read_cnt signal 444, the odd_block signal 432, and the read_en signal 436 for controlling the reading of the 32-bit code words from the RAM 402 in accordance with equations {2} and {4}. As each of the code words is read, it is output on the word bus 107 for further processing by the processing system 110. Preferably, to conserve power the RAM 402 is enabled in a manner well known in the art by additional circuitry (not shown) only when the processor 404 has data to write to or read from the RAM 402.

Also preferably, the deinterleaver 106 is fabricated as a single, contiguous integrated circuit. It will be appreciated that, alternatively, the deinterleaver can be fabricated as multiple integrated circuits, or from discrete devices. On the other hand, it will be appreciated that, as a further alternative, the deinterleaver 106 and the processing system 110 can be fabricated as a single custom integrated circuit.

These and other alternative arrangements do not depart from the scope and intent of the claimed invention.

Figure 5:
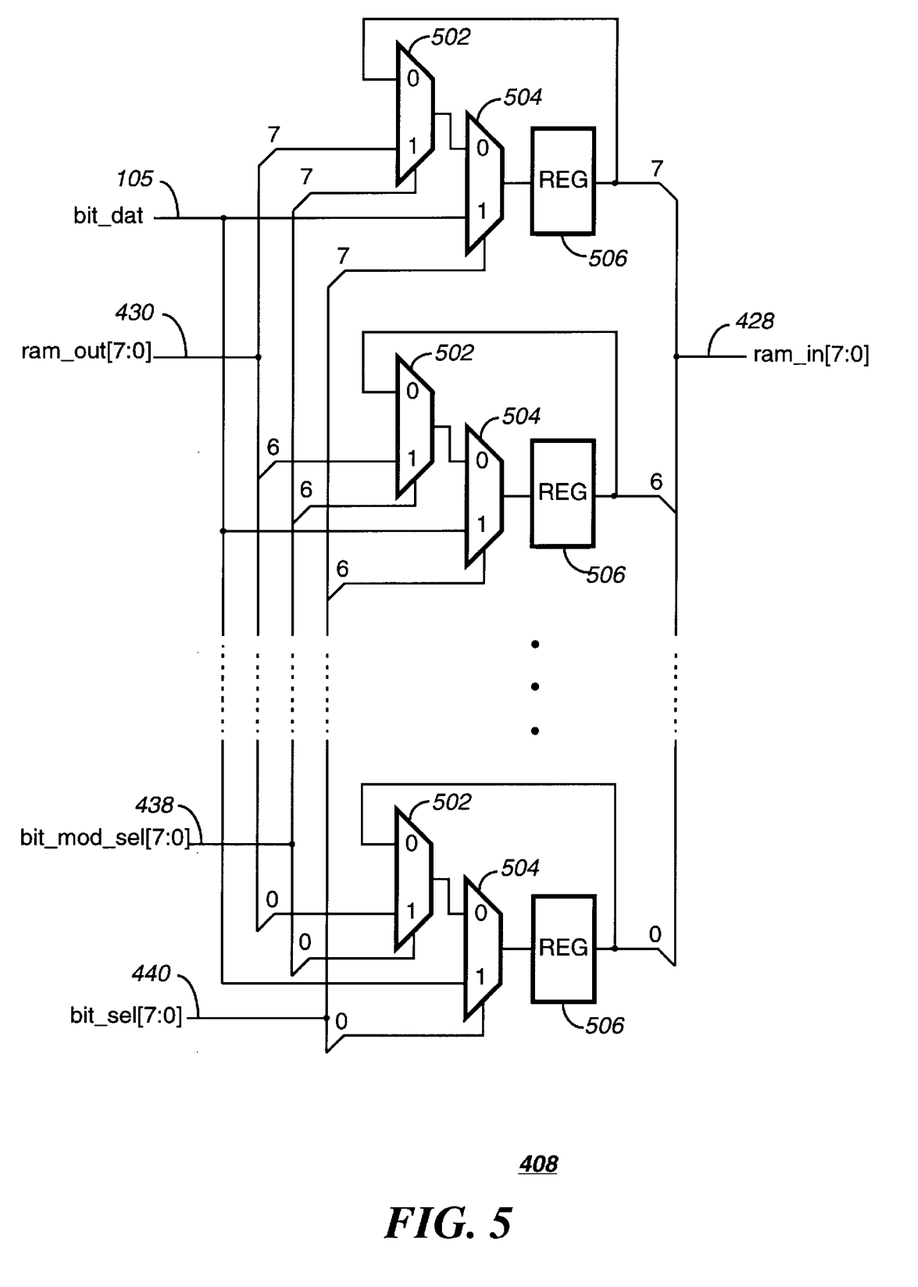
FIG. 5 is an electrical block diagram of a data read-modify-write logic circuit in accordance with the preferred embodiment of the present invention.

FIGS. 5–9 depict in greater detail the major blocks of the deinterleaver 106. Referring to FIG. 5, an electrical block diagram of the data read-modify-write logic circuit 408 in accordance with the preferred embodiment of the present invention is depicted. The data read-modify-write logic circuit 408 comprises eight conventional multiplexers 502 for selecting, responsive to the bit_mod_sel signal 438, which bits of the RAM 402 will be read from the ram_out signal 430 and stored in eight conventional registers 506. The data read-modify-write logic circuit 408 further comprises eight conventional multiplexers 504 responsive to the bit_sel signal 440 for selecting which one of the registers 506 will receive an incoming data bit from the bit_data line 105. When the read-modify operation has been completed for the currently addressed word in the RAM 402, the modified data stored in the registers 506 generates the appropriate ram_in signal 428 for writing the modified data into the RAM 402 during the next write cycle of the RAM 402.

Figure 6:
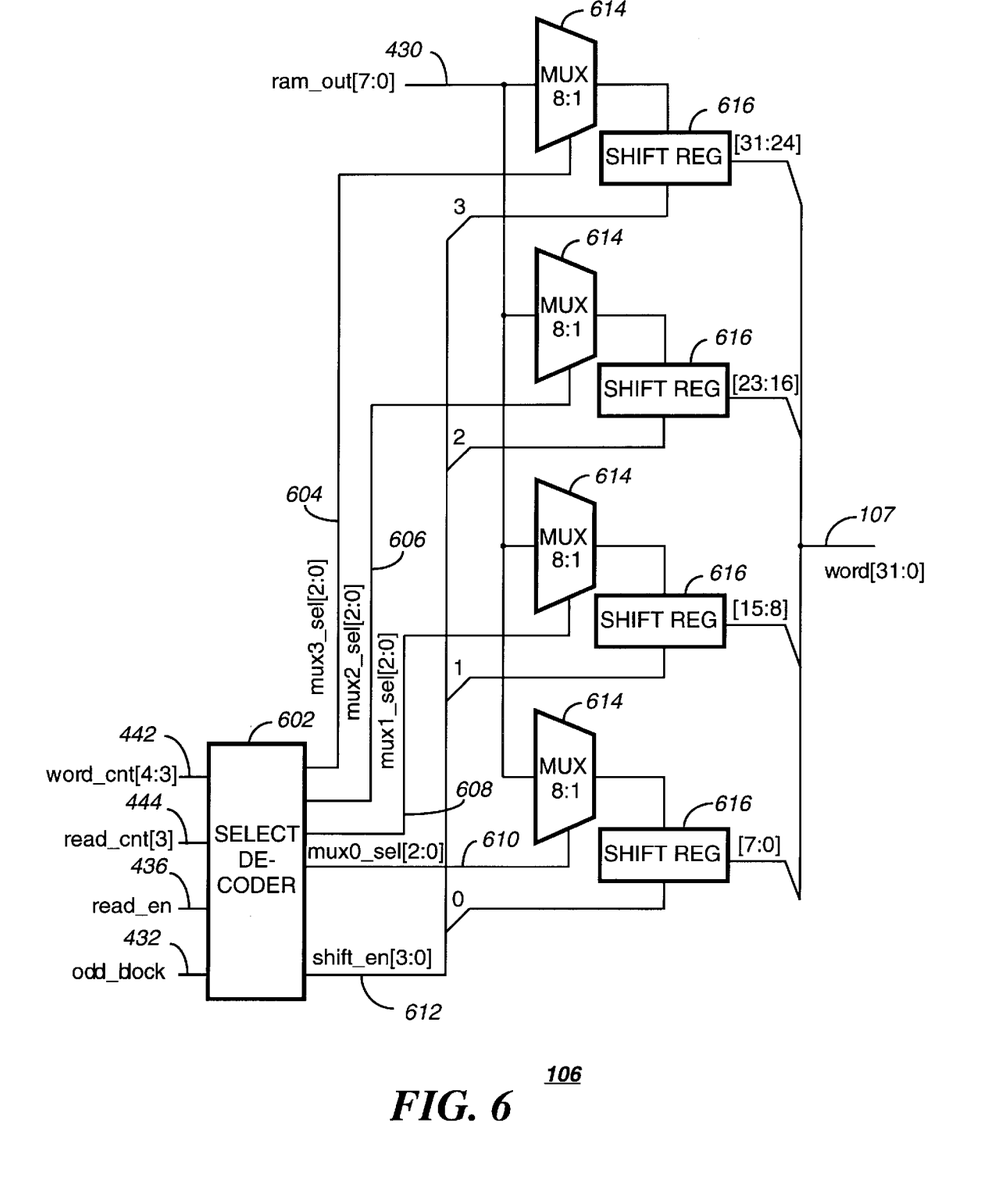
FIG. 6 is an electrical block diagram of a data read logic circuit in accordance with the preferred embodiment of the present invention.

FIG. 6 is an electrical block diagram of the data read logic circuit 426 in accordance with the preferred embodiment of the present invention. The data read logic circuit 426 comprises a select decoder circuit 602 for generating four three-bit mux_sel (multiplexer select) signals 604–610 for selecting which bits of the ram_out signal 430 are to be passed by each of four 8:1 multiplexers 614 for accumulation in four eight-bit shift registers 616. The select decoder circuit 602 also generates a four-bit shift_en (shift enable) signal 612 for determining which of the shift registers 616 will record and then shift the data value passed by the multiplexers 614. The select decoder circuit 602 is responsive to selected bits of the word_cnt signal 442 and the read_cnt signal 444, as well as to the read_en signal 436 and the odd_block signal 432, for generating the mux_sel signals 604–610 and the shift_en signal 612 to recover the 32-bit code words from the RAM 402 in accordance with equations {2} and {4}.

Figure 7:
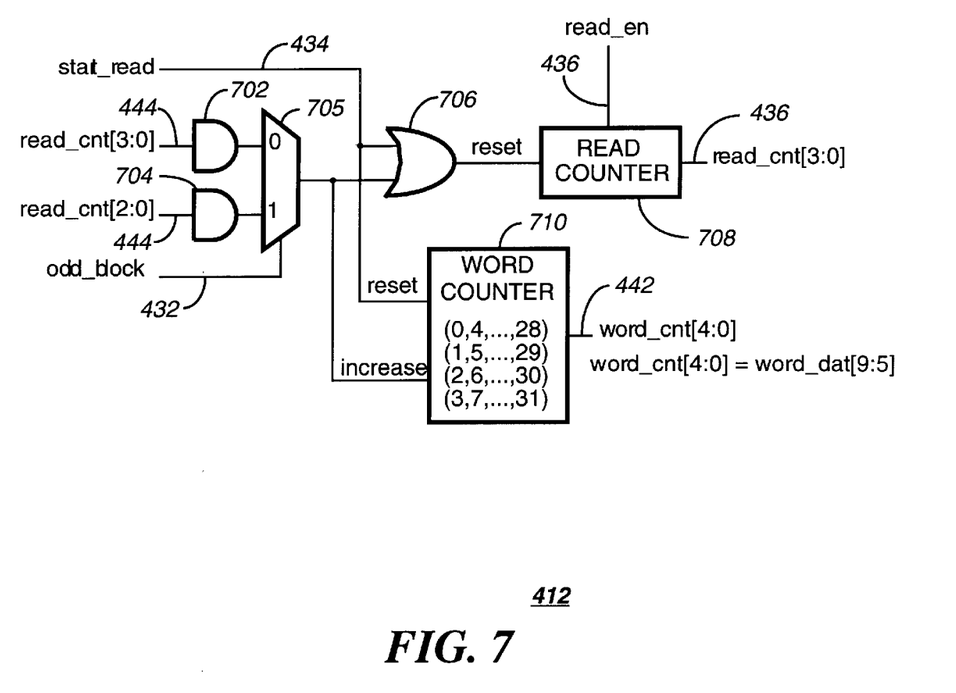
FIG. 7 is an electrical block diagram of a read counter logic circuit in accordance with the preferred embodiment of the present invention.

FIG. 7 is an electrical block diagram of the read counter logic circuit 412 in accordance with the preferred embodiment of the present invention. The read counter logic circuit 412 comprises conventional combinational logic circuits 702, 704, 705, 706 coupled as shown, a conventional read counter 708 for generating the read_cnt signal 444, and a conventional word counter 710 for generating the word_cnt signal 442. Both the read counter 708 and the word counter are reset by the start_read signal 434. The read counter is incremented by the read_en signal 436. The read counter 708 is also reset when the read_cnt signal 444 reaches the maximum number of reads to recover a code word (i.e., sixteen for even blocks and eight for odd blocks.) The word counter 710 is incremented when the read_cnt signal 444 reaches the maximum number of reads to recover a code word.

Figure 8:
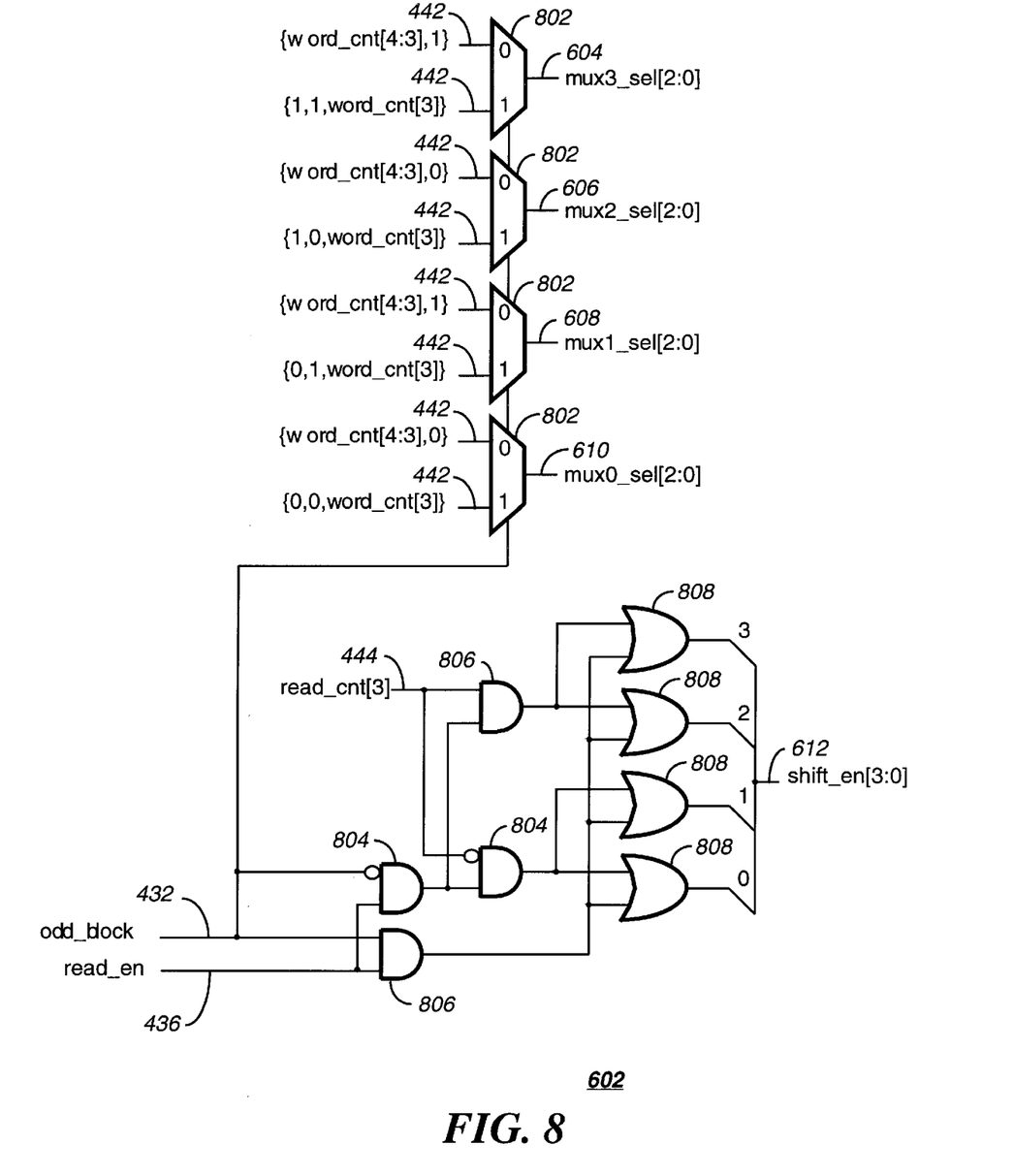
FIG. 8 is an electrical block diagram of a select decoder logic circuit in accordance with the preferred embodiment of the present invention.

FIG. 8 is an electrical block diagram of the select decoder logic circuit 602 in accordance with the preferred embodiment of the present invention. The select decoder logic circuit 602 comprises four conventional multiplexers 802 controlled by the odd_block signal 432 and coupled to selected bits of the word_cnt signal 442 and to additional hard-wired bits for generating the mux_sel signals 604–610. The select decoder logic circuit 602 further comprises conventional combinational logic 804, 806, 808 coupled as shown to the read_cnt signal 444, the odd_block signal 432, and the read_en signal 436 to generate the shift_en signal 612. The mux_sel signals 604–610 cooperate with the shift_en signal 612 to read the deinterleaved code words from the RAM 402 in accordance with equations {2} and {4}.

Figure 9:
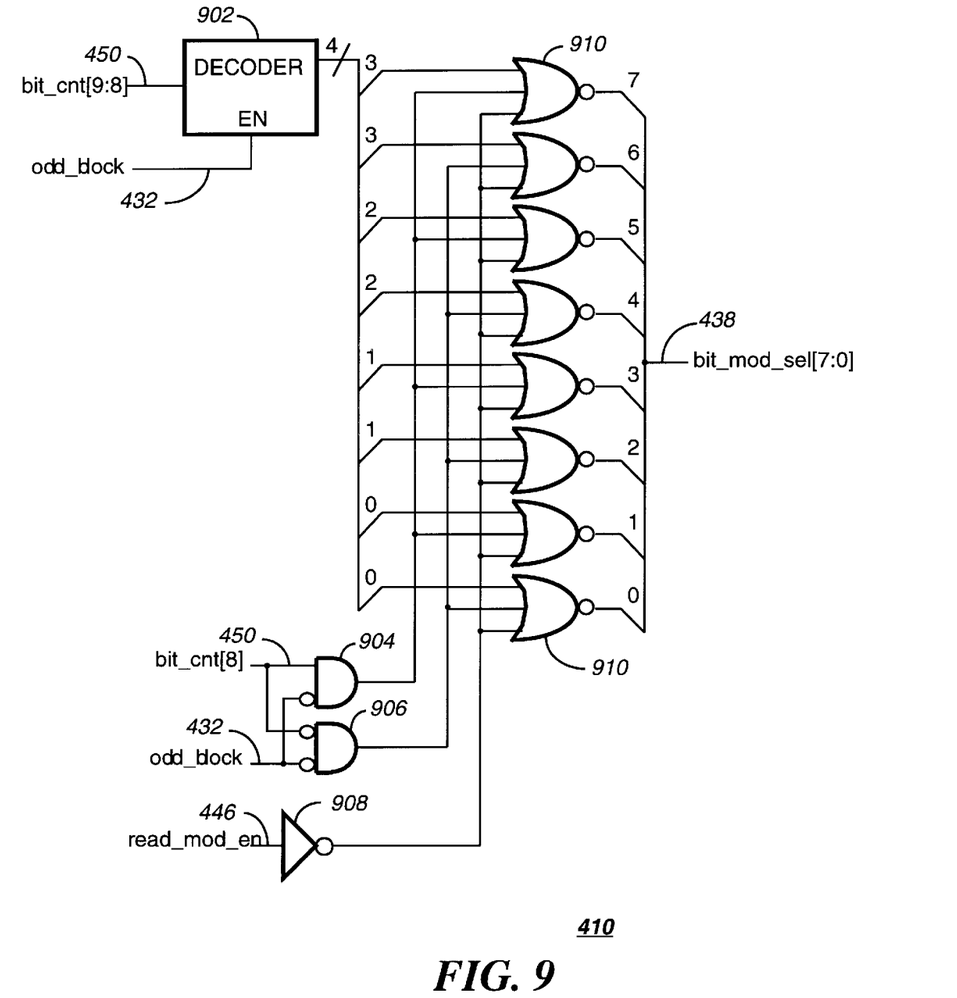
FIG. 9 is an electrical block diagram of a bit modify select logic circuit in accordance with the preferred embodiment of the present invention.

FIG. 9 is an electrical block diagram of the bit modify select logic circuit 410 in accordance with the preferred embodiment of the present invention. The bit modify select logic circuit 410 comprises a conventional decoder 902 coupled to the bit_cnt signal 450 and to the odd_block signal 432 for generating four select signals coupled in pairs to first inputs of eight NOR gates 910. The bit modify select logic circuit 410 further comprises additional conventional logic circuits 904, 906, and 908 coupled as shown to selected second and third inputs of the NOR gates 910. When the read_mod en signal 446 is high, the bit modify select logic circuit 410 asserts six of the eight bits of the bit_mod_sel signal 438 for odd numbered data blocks. For even numbered data blocks the bit modify select logic circuit 410 asserts bits 0, 2, 4, and 6 of the bit_mod_sel signal 438 when the eighth bit of the bit_count signal is high, and asserts bits 1, 3, 5, and 7 of the bit_mod_sel signal 438 when the eighth bit of the bit_count signal is low. The bit_mod_sel signal 438 then is utilized by the data read-modify-write logic circuit 408 as described herein above, for writing the incoming data bits to the RAM 402 in accordance with equations {1} and {3}.

Figure 10:
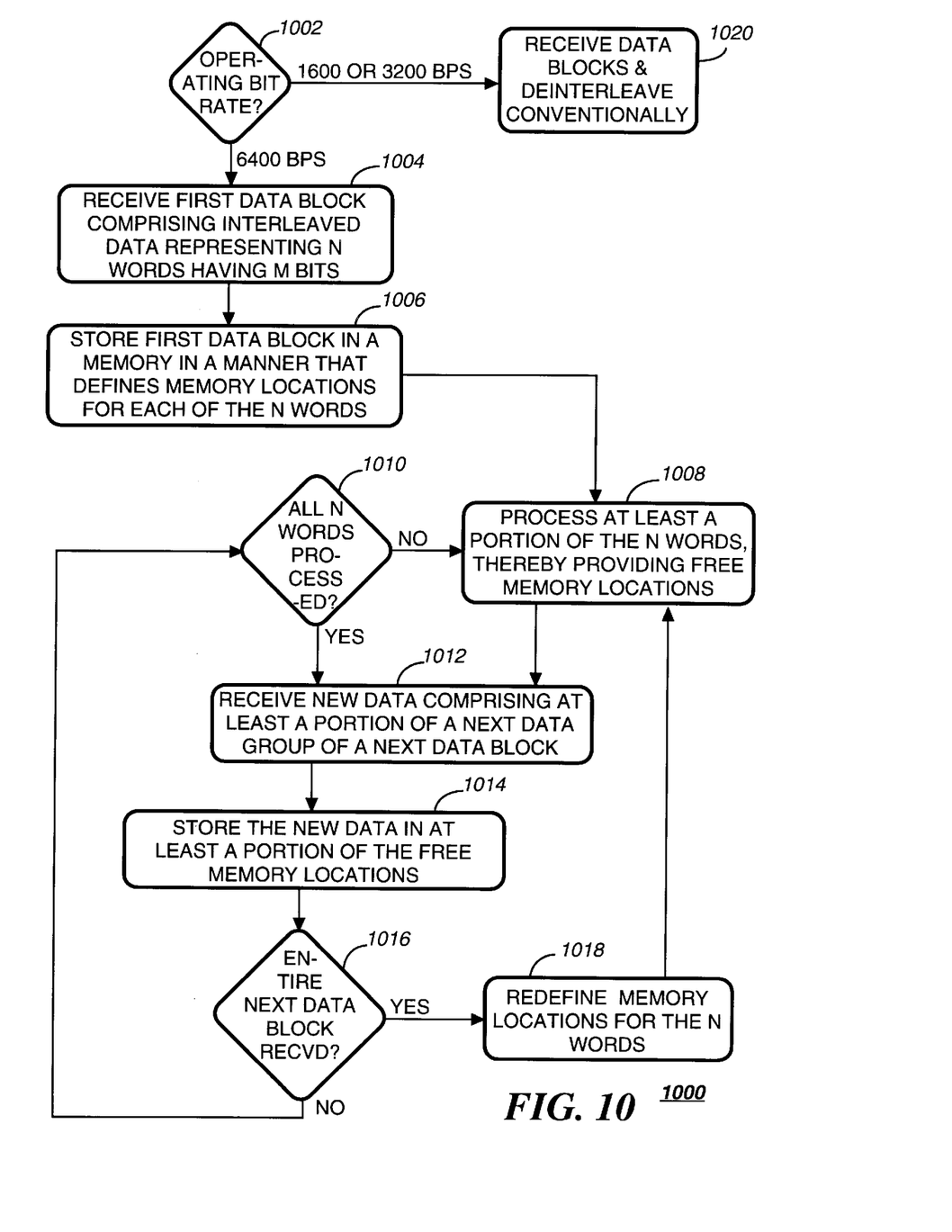
FIG. 10 is a flow chart of a deinterleaving method in accordance with the preferred embodiment of the present invention.

FIG. 10 is a flow chart of a deinterleaving method in accordance with the preferred embodiment of the present invention. The flow chart begins with a decision 1002 as to whether the operating bit rate is 1600 bps, 3200 bps, or 6400 bps. If the bit rate is either 1600 or 3200 bps, then the incoming data blocks are received and deinterleaved in a conventional manner preferably using two separate portions of the RAM 402. The deinterleaving preferably is performed by additional conventional hardware (not shown). Alternatively, the conventional deinterleaving can be performed by the processing system 110 under software control.

If, on the other hand, the bit rate is 6400 bps, then the deinterleaving is performed in accordance with the present invention. In step 1004 the first data block is received. The data block comprises interleaved data representing N words having M bits in M bit positions, and is transmitted as a series of data groups, each data group including N bits of data corresponding to a single bit position of all the N words. In step 1006 the processing system 110 and the processor 404 cooperate to store the first data block in the RAM 402 in a manner that defines memory locations for each of the N words. Because the locations of the N words are defined, and the N words can be read directly from the RAM 402, the first data block has, by definition, been deinterleaved.

In step 1008 the processor 404 and the processing system 110 cooperate to process at least a portion of the N words stored in the RAM 402, thereby providing free memory locations in the RAM 402. In step 1012 the processor 404 receives new data from the receiver 104. The new data comprises at least a portion of a next data group of a next data block. The processor 404 then stores 1014 the new data in at least a portion of the free memory locations in the RAM 402. In step 1016 the processor 404 and the processing system 110 cooperate to determine whether the entire next data block has been received. If not, the flow moves to step 1010 to check whether all N words of the previously stored data block have been read from the RAM 402 and processed. If not, flow returns to step 1008 to process additional portions of the N words. If all N words have been processed, then flow skips step 1008 and returns directly to step 1012 to receive additional new data.

In step 1016, when the processor 404 and the processing system 110 determine that the entire next data block has been received, the processor 404 and the processing system 110 then cooperate to redefine 1018 the memory locations for the (newly stored) N words, thereby deinterleaving the newly stored N words. Then the flow returns to step 1008 to begin processing the newly stored N words. This process repeats indefinitely for as long as new data blocks are received.

Thus it should be apparent by now that the present invention provides a method and apparatus that advantageously accomplishes deinterleaving of an interleaved data signal while utilizing only a single memory array for the deinterleaving process. The method and apparatus also minimize accesses to the memory array, thereby advantageously conserving power and prolonging battery life in portable equipment which utilizes the present invention.

Various other embodiments and modifications of the present invention may reasonably occur to one of ordinary skill in the art. Accordingly, the scope of the invention is delimited only in accordance with the following claims.

What is claimed is:

1. A method of deinterleaving an interleaved data stream transmitted as a plurality of data blocks, each data block comprising interleaved data representing N words having M bits in M bit positions, the data block transmitted as a sequence of data groups, each data group including N bits of data from a single bit position of all the N words, the method comprising the steps of:

(a) receiving a first data block of the interleaved data stream;

(b) storing the first data block in a memory in a manner that defines memory locations for each of the N words, thereby deinterleaving the first data block; and (c) receiving a next data block, comprising the steps of:

(d) processing at least a portion of the N words stored previously in the memory, thereby providing free memory locations, unless all of said N words have been processed;

(e) thereafter receiving new data comprising at least a portion of a next data group of said next data block;

(f) storing the new data in at least a portion of the free memory locations;

(g) repeating steps (d), (e), and (f) until said next data block has been received and stored in entirety; and (h) redefining the memory locations for the N words after said next data block has been received and stored in entirety, thereby deinterleaving said next data block, wherein the plurality of data blocks consist of first and second sets, one of the first and second sets consisting of odd numbered data blocks, and another one of the first and second sets consisting of even numbered data blocks, wherein interleaved data of one of the even or the odd numbered data blocks can be read into the memory rowwise and deinterleaved words can be read out columnwise, while interleaved data of the other of the even or odd numbered data blocks can be read into the memory columnwise and deinterleaved words can be read out rowwise.

2. The method of claim 1, further comprising the step of repeating step (c) to receive and deinterleave additional ones of the plurality of data blocks.

3. The method of claim 1, wherein N=M, and wherein step (d) comprises the step of processing one of the N words stored previously in the memory, and wherein step (e) comprises the step of receiving the next data group of said next data block, and wherein step (f) comprises the step of storing said next data group in the free memory locations utilized previously for storing said one of the N words.

4. The method of claim 1, wherein step (f) comprises the step of storing the new data in a manner that minimizes a number of memory accesses required to store one of the plurality of data blocks and to read the N words of the one of the plurality of data blocks.

5. The method of claim 1, wherein the interleaved data stream can be transmitted at one of 1600, 3200, and 6400 bits per second (bps), and wherein for 1600 bps data, N=8 and M=32, and wherein for 3200 bps data, N=16 and M=32, and wherein for 6400 bps data, N=32 and M=32, and wherein for the 6400 bps data, said method is utilized for deinterleaving the plurality of data blocks, and wherein for the 3200 and 1600 bps data, an alternative method is utilized for deinterleaving the plurality of data blocks.

6. The method of claim 1, wherein N=M=32, and wherein the memory comprises 128 eight-bit words, and wherein the method further comprises the step of maintaining a ten-bit bit count for counting bits of the data block as they are stored in the memory, and wherein a first bit address for storing each of the bits as received in the memory is determined as follows:
first bit address(9:0)=bit count(7:5,9,4:0,8), and wherein a second bit address for reading each of the bits of the N words from the memory is determined as follows:
second bit address(5:1,6,0,9:7)=word address(9:0), and wherein a third bit address for storing each of the bits as received in the memory is determined as follows:
third bit address(9:0)=bit count(4:1,7:5,9:8,0), and wherein a fourth bit address for reading each of the bits of the N words from the memory is determined as follows:
fourth bit address(9:6,0,2:1,5:3)=word address(9:0), and wherein the plurality of data blocks consist of first and second sets, one of the first and second sets consisting of odd numbered data blocks, and another one of the first and second sets consisting of even numbered data blocks, and wherein the first and second bit addresses are utilized for storing and reading the first set, while the third and fourth bit addresses are utilized for storing and reading the second set.

7. An apparatus for deinterleaving an interleaved data stream transmitted as a plurality of data blocks, each data block comprising interleaved data representing N words having M bits in M bit positions, the data block transmitted as a sequence of data groups, each data group including N bits of data from a single bit position of all the N words, the apparatus comprising:

a receiver for receiving a first data block of the interleaved data stream;

a memory coupled to the receiver for storing the first data block in a manner that defines memory locations for each of the N words, thereby deinterleaving the first data block; and a processor coupled to the receiver and coupled to the memory for controlling reception of a next data block, wherein the processor is programmed to:

process at least a portion of the N words stored previously in the memory, thereby providing free memory locations, unless all of said N words have been processed;

receive new data comprising at least a portion of a next data group of said next data block;

store the new data in at least a portion of the free memory locations;

continue to process the N words stored previously and to receive and store new data in the free memory locations provided, until said next data block has been received and stored in entirety; and redefine the memory locations for the N words after said next data block has been received and stored in entirety, thereby deinterleaving said next data block, wherein the plurality of data blocks consist of first and second sets, one of the first and second sets consisting of odd numbered data blocks, and another one of the first and second sets consisting of even numbered data blocks, wherein interleaved data of one of the even or the odd numbered data blocks can be read into the memory rowwise and deinterleaved words can be read out columnwise, while interleaved data of the other of the even or odd numbered data blocks can be read into the memory columnwise and deinterleaved words can be read out rowwise.

8. The apparatus of claim 7, wherein the processor is further programmed to continue to receive and deinterleave additional ones of the plurality of data blocks.

9. The apparatus of claim 7, wherein N=M, and wherein the processor is further programmed to process one of the N words stored previously in the memory, to receive the next data group of said next data block, and to store said next data group in the free memory locations utilized previously for storing said one of the N words.

10. The apparatus of claim 7, wherein the processor is further programmed to store the new data in a manner that minimizes a number of memory accesses required to store one of the plurality of data blocks and to read the N words of the one of the plurality of data blocks.

11. The apparatus of claim 7, wherein the interleaved data stream can be transmitted at one of 1600, 3200, and 6400 bits per second (bps), and wherein for 1600 bps data, N=8 and M=32, and wherein for 3200 bps data, N=16 and M=32, and wherein for 6400 bps data, N=32 and M=32, and wherein for the 6400 bps data, the processor is programmed to deinterleave the plurality of data blocks by storing the new data in the free memory locations provided by processing of previously stored words, and wherein for the 3200 and 1600 bps data, the processor is programmed to utilize an alternative method for deinterleaving the plurality of data blocks.

12. The apparatus of claim 7, wherein N=M=32, and wherein the memory comprises 128 eight-bit words, and wherein the processor is further programmed to:

maintain a ten-bit bit count for counting bits of the data block as they are stored in the memory, determine a first bit address for storing each of the bits as received in the memory as follows:

first bit address(9:0)=bit count(7:5,9,4:0,8),
determine a second bit address for reading each of the bits of the N words from the memory as follows:
second bit address(5:1,6,0,9:7)=word address(9:0),
determine a third bit address for storing each of the bits as received in the memory as follows:
third bit address(9:0)=bit count(4:1,7:5,9:8,0), and
determine a fourth bit address for reading each of the bits of the N words from the memory as follows:
fourth bit address(9:6,0,2:1,5:3)=word address(9:0), and wherein the plurality of data blocks consist of first and second sets, one of the first and second sets consisting of odd numbered data blocks, and another one of the first and second sets consisting of even numbered data blocks, and wherein the processor is further programmed to utilize the first and second bit addresses for storing and reading the first set, and to utilize the third and fourth bit addresses for storing and reading the second set.

13. A communication receiver for deinterleaving an interleaved data stream transmitted as a plurality of data blocks, each data block comprising interleaved data representing N words having M bits in M bit positions, the data block transmitted as a sequence of data groups, each data group including N bits of data from a single bit position of all the N words, the communication receiver comprising:

an antenna for intercepting a radio signal carrying the plurality of data blocks;

a receiver coupled to the antenna for receiving a first data block of the interleaved data stream;

a memory coupled to the receiver for storing the first data block in a manner that defines memory locations for each of the N words, thereby deinterleaving the first data block;

a user interface coupled to the memory for conveying to a user information represented by the plurality of data blocks; and a processor coupled to the receiver and coupled to the memory for controlling reception of a next data block, wherein the processor is programmed to:

process at least a portion of the N words stored previously in the memory, thereby providing free memory locations, unless all of said N words have been processed;

receive new data comprising at least a portion of a next data group of said next data block;

store the new data in at least a portion of the free memory locations;

continue to process the N words stored previously and to receive and store new data in the free memory locations provided, until said next data block has been received and stored in entirety; and redefine the memory locations for the N words after said next data block has been received and stored in entirety, thereby deinterleaving said next data block, wherein the plurality of data blocks consist of first and second sets, one of the first and second sets consisting of odd numbered data blocks, and another one of the first and second sets consisting of even numbered data blocks, wherein interleaved data of one of the even or the odd numbered data blocks can be read into the memory rowwise and deinterleaved words can be read out columnwise, while interleaved data of the other of the even or odd numbered data blocks can be read into the memory columnwise and deinterleaved words can be read out rowwise.

14. The communication receiver of claim 13, wherein the processor is further programmed to continue to receive and deinterleave additional ones of the plurality of data blocks.

15. The communication receiver of claim 13, wherein N=M, and wherein the processor is further programmed to process one of the N words stored previously in the memory, to receive the next data group of said next data block, and to store said next data group in the free memory locations utilized previously for storing said one of the N words.

16. The communication receiver of claim 13, wherein the processor is further programmed to store the new data in a manner that minimizes a number of memory accesses required to store one of the plurality of data blocks and to read the N words of the one of the plurality of data blocks.

17. The communication receiver of claim 13, wherein the interleaved data stream can be transmitted at one of 1600, 3200, and 6400 bits per second (bps), and wherein for 1600 bps data, N=8 and M=32, and wherein for 3200 bps data, N=16 and M=32, and wherein for 6400 bps data, N=32 and M=32, and wherein for the 6400 bps data, the processor is programmed to deinterleave the plurality of data blocks by storing the new data in the free memory locations provided by processing of previously stored words, and wherein for the 3200 and 1600 bps data, the processor is programmed to utilize an alternative method for deinterleaving the plurality of data blocks.

18. The communication receiver of claim 13, wherein N=M=32, and wherein the memory comprises 128 eight-bit words, and wherein the processor is further programmed to:

maintain a ten-bit bit count for counting bits of the data block as they are stored in the memory, determine a first bit address for storing each of the bits as received in the memory as follows:

first bit address(9:0)=bit count(7:5,9,4:0,8), determine a second bit address for reading each of the bits of the N words from the memory as follows:

second bit address(5:1,6,0,9:7)=word address(9:0), determine a third bit address for storing each of the bits as received in the memory as follows:

third bit address(9:0, )=bit count(4:1,7:5,9:8,0), and determine a fourth bit address for reading each of the bits of the N words from the memory as follows:

fourth bit address(9:6,0,2:1,5:3)=word address(9:0), and wherein the plurality of data blocks consist of first and second sets, one of the first and second sets consisting of odd numbered data blocks, and another one of the first and second sets consisting of even numbered data blocks, and wherein the processor is further programmed to utilize the first and second bit addresses for storing and reading the first set, and to utilize the third and fourth bit addresses for storing and reading the second set.

* * * * *